United States Patent
Curtis et al.

(10) Patent No.: US 7,286,352 B2
(45) Date of Patent: Oct. 23, 2007

(54) THERMALLY EXPANDING BASE OF HEATSINK TO RECEIVE FINS

(75) Inventors: Robert B. Curtis, Allen, TX (US); Roy Mehdi Zeighami, Mckinney, TX (US); Christian L. Belady, mckinney, TX (US); Brent A. Boudreaux, Highland Village, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 225 days.

(21) Appl. No.: 11/107,187

(22) Filed: Apr. 15, 2005

(65) Prior Publication Data

US 2006/0232932 A1    Oct. 19, 2006

(51) Int. Cl.
*H05K 7/20* (2006.01)
*F28F 7/00* (2006.01)

(52) U.S. Cl. .................................. 361/697; 165/80.3

(58) Field of Classification Search .......... 361/697, 361/700, 703, 698; 165/185, 80.3; 439/487
See application file for complete search history.

(56) References Cited

U.S. PATENT DOCUMENTS

| | | | | |
|---|---|---|---|---|
| 3,579,805 | A * | 5/1971 | Kast | 148/529 |
| 3,948,533 | A * | 4/1976 | Novosad | 277/370 |
| 5,014,776 | A * | 5/1991 | Hess | 165/185 |
| 5,254,025 | A * | 10/1993 | Spaulding et al. | 445/26 |
| 5,771,966 | A * | 6/1998 | Jacoby | 165/185 |
| 5,985,697 | A | 11/1999 | Chaney et al. | |
| 6,034,430 | A | 3/2000 | Hamburgen | |
| 6,633,484 | B1 * | 10/2003 | Lee et al. | 361/697 |
| 6,742,581 | B2 * | 6/2004 | Mochizuki et al. | 165/185 |
| 6,758,262 | B2 * | 7/2004 | Kawabata et al. | 165/80.3 |
| 7,108,055 | B2 * | 9/2006 | Krassowski et al. | 165/185 |
| 2002/0041959 | A1 | 4/2002 | Kawai | |
| 2002/0070005 | A1 * | 6/2002 | Kawabata et al. | 165/80.3 |
| 2002/0166654 | A1 | 11/2002 | Smaic | |
| 2003/0178190 | A1 | 9/2003 | Ellsworth | |
| 2003/0183379 | A1 * | 10/2003 | Krassowski et al. | 165/185 |
| 2003/0221816 | A1 | 12/2003 | Ellsworth | |
| 2004/0134646 | A1 | 7/2004 | Chu | |
| 2004/0264134 | A1 | 12/2004 | Cheng | |
| 2005/0000682 | A1 * | 1/2005 | Chien et al. | 165/80.3 |
| 2005/0211416 | A1 * | 9/2005 | Kawabata et al. | 165/80.3 |

OTHER PUBLICATIONS

Julian Norley, The Development of a Natural Graphite Heat-Spreader, Graftech Inc., 2001 IEEE.
Julian Norley, High Performance, Lightweight Graphite Heat Sinks/Spreaders, Graftech Inc., PCIM 2002, Nurnberg, Germany, May 14-16, 2002, 2002 IEEE.
E.E. Marotta, Thermal Performance of a Silicon-Die/Water-Cooled Heatsink Assembly: Experimental Investigation, 41st Aerospace Sciences Meeting and Exhibit, Jan. 6-9, 2003.

* cited by examiner

*Primary Examiner*—Chandrika Prasad

(57) ABSTRACT

Embodiments include apparatus, methods, and systems providing a heatsink for electronic heat generating components. In one embodiment, the heatsink includes a metal base having a plurality of grooves, and a plurality of graphite fins connected to the base. The fins thermally dissipate heat from the base and into a surrounding environment. The fins are secured within the grooves with an interference fit produced by thermally expanding the base.

20 Claims, 3 Drawing Sheets

THERMALLY EXPANDING BASE OF HEATSINK TO RECEIVE FINS

BACKGROUND

Heatsinks transfer heat away from a heat source to a surrounding environment. The transfer of heat occurs more effectively if the heatsink is fabricated from material that has a high coefficient of thermal conductivity. Such materials include copper and aluminum since these materials facilitate the conduction and dissipation of heat. Some heatsinks are configured with aluminum base and fins, copper base and fins, aluminum base with copper fins, or copper base with aluminum fins.

In order to increase thermal conductivity and decrease weight, some heatsinks are fabricated with graphite. Graphite weighs less than aluminum and has better thermal conductivity. Graphite, however, is brittle and can flake or chip. As such, the base of a heatsink is typically not formed from graphite. Instead, graphite is more often used for the fins of the heatsink.

Metallic fins can be attached to the metallic base using various technologies, such as solder, epoxy, and swaging. These technologies, though, are not ideal for attaching graphite fins to a metal base. Solder does not achieve optimal wetting when used with graphite fins. Epoxy has a low thermal conductivity and thus is not well suited for heat transfer from the base to the fins. In addition, solder or epoxy can degrade over time and cause the fins to become loose or dislodged. In the process of swaging, a tool is used to plastically deform the metal base around the base of the fin in order to secure the fin to the base of the heatsink. During the swaging process, graphite flakes from the fins can dislodge and contaminate surrounding electrical circuitry.

DETAILED DESCRIPTION

Figure 1:
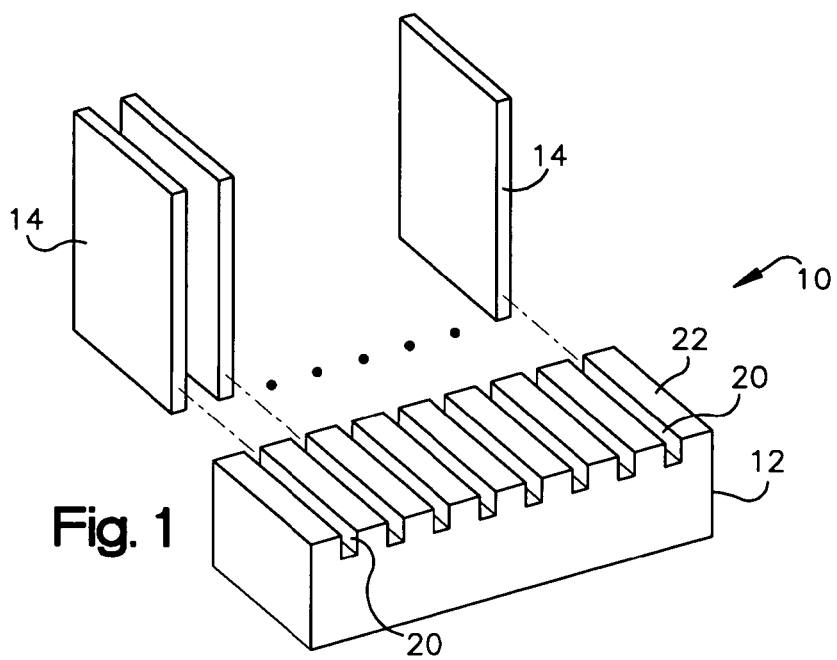
FIG. 1 is a perspective view of an exemplary heatsink before attaching the fins in accordance with the present invention.
Figure 2:
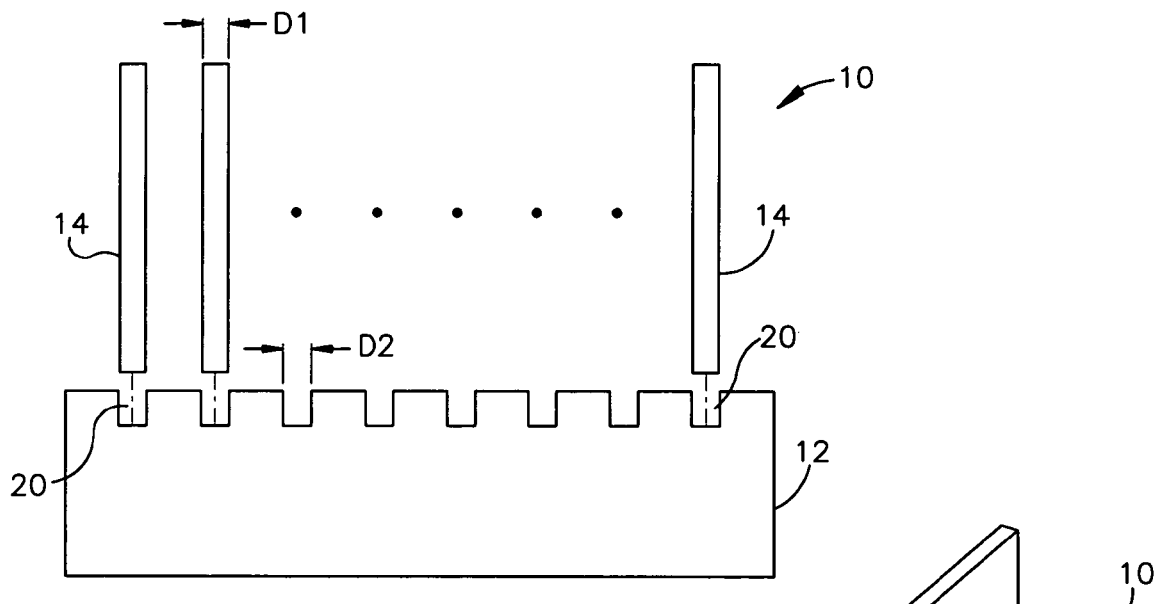
FIG. 2 is a side view of the heatsink of FIG. 1 in accordance with the present invention.
Figure 3:
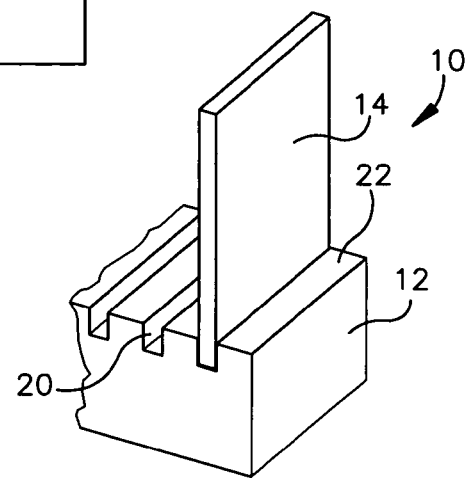
FIG. 3 is a partial perspective view of the exemplary heatsink of FIG. 1 with a fin attached in accordance with the present invention.

FIGS. 1-3 illustrate a heatsink 10 comprising a base 12 and a plurality of fins 14 extending outwardly from the base 12. The base 12 supports the fins and includes a plurality of grooves or channels 20 formed in a top surface 22 of the base. The grooves can have a variety of configurations. In one exemplary embodiment, the grooves are elongated parallel depressions having a shape and size to receive an end of a fin 14.

The fins are disposed and secured in the grooves 20 of the base 12 and are adapted to thermally dissipate or transfer heat away from the base 12 and into a surrounding environment. In one exemplary embodiment, the fins 14 extend outwardly from the base 12 in a parallel and planar spaced relationship. The fins can have various configurations and still be within exemplary embodiments of the invention. As one example, the fins have a planar configuration having large surface areas to maximize heat transfer from the surface of a fin to a surrounding environment. Configurations of planar and non-planar surfaces include, but are not limited to, rectangular, square, round, elliptical, angular, bent, circular, and other geometrical shapes.

The base 12 and fins 14 can be made from a variety of materials. Preferably, such materials are light weight and have a high coefficient of thermal conductivity. Examples of such materials include, but are not limited to, copper, aluminum, tungsten, molybdenum, graphite, graphite-epoxy composite, or other metals, composites, and/or alloys.

In some exemplary embodiments, the base 12 and the fins 14 are formed from the same materials, while in other exemplary embodiments they are formed from different materials. By way of example, the base and fins are both formed from one of the noted materials (i.e., copper aluminum, graphite, etc.). As another example, the base 12 is formed from one of the noted materials, and the fins are formed from another noted material. By way of further example, the base 12 is formed from copper or aluminum, and the fins 14 are formed from graphite or graphite composite.

In one exemplary embodiment, the shape and size of the fins 14 match or substantially match the shape and size of grooves 20. For example, the fins (such as an end, side, or edge) are shaped and sized to press-fit or interference fit within the grooves. In one embodiment, the fins have an end or edge portion that is slightly larger than the grooves to enable an interference fit between the fins and the base. The interference fit is sufficient to securely attach and retain the fins to the base without the need of other or secondary attachment techniques or means, such as solder, epoxy, or swaging. As best shown in FIG. 2, the fins 14 have a thickness D1, and the grooves 20 have an entrance opening or a thickness D2. In one embodiment, D1 is slightly greater than D2.

Figure 4:
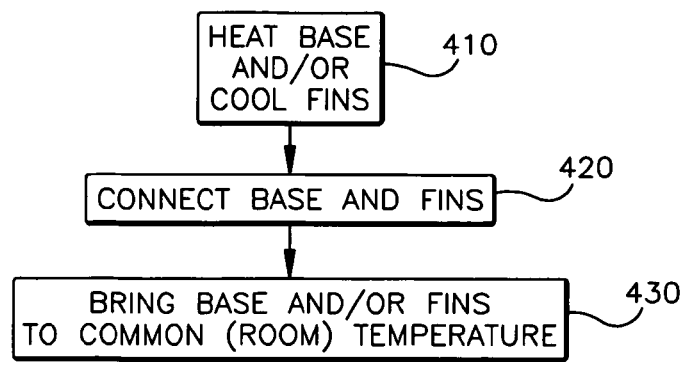
FIG. 4 is a flow diagram of an exemplary method in accordance with the present invention.

FIG. 4 shows an exemplary flow diagram for attaching or connecting the fins 14 to the base 12. According to block 410, in order to overcome interference and assemble the fins 14 to the base 12, the base is heated and/or the fins are cooled. Heating the base 12 will cause it to expand, and cooling the fins 14 will cause them to contract. In one embodiment then, the base is expanded, with heat, to a size sufficient so the fins 14 can fit into the grooves 20. In another embodiment, the fins are contracted, by cooling, to a size sufficient so the fins 14 can fit within the grooves 20. In yet another embodiment, the base is heated and simultaneously the fins are cooled so the fins can fit within the grooves.

According to block 420, once the base is heated and/or the fins are cooled, the base and fins are connected together. The temperature to which the base 12 is heated (example, above room temperature) or fins 14 cooled (example, below room temperature) depends on many factors, such as the material of the fins and base, the size of the grooves 20 with respect to the fins, and the amount or degree of interference between the grooves and the fins. Preferably, the amount of interference is sufficient to secure the fins over all heat operating temperatures of the heatsink 10. Further, prior to inserting the fins into the base, the thermal conductivity of the joint between the grooves and fins can be enhanced with the addition of thermal grease (shown for example in FIG. 7 as 730) or other thermally enhancing material, such as indium.

According to block 430, after the base and fins are connected, the components are brought to a common temperature, such as room temperature. Once the assembled base and fins reach a common temperature, the components return to their original size and thus introduce an interference fit or force fit between the base of the heatsink and fins. As used herein, "room temperature" is an indoor temperature from about 20° C. to 25° C. (68° F. to 77° F.).

Thus, in one exemplary embodiment, thermal expansion is used to connect the fins to the base. As used herein, "thermal expansion" is the tendency of an object to increase in size (such as length, width, thickness, or volume) when heated. In another exemplary embodiment, cooling and contraction are used to connect the fins to the base. As used herein, "contraction" is the tendency of an object to decrease in size (such as length, width, thickness, or volume). In other embodiments, thermal expansion and contraction through cooling are used to connect the fins to the base.

Figure 5:
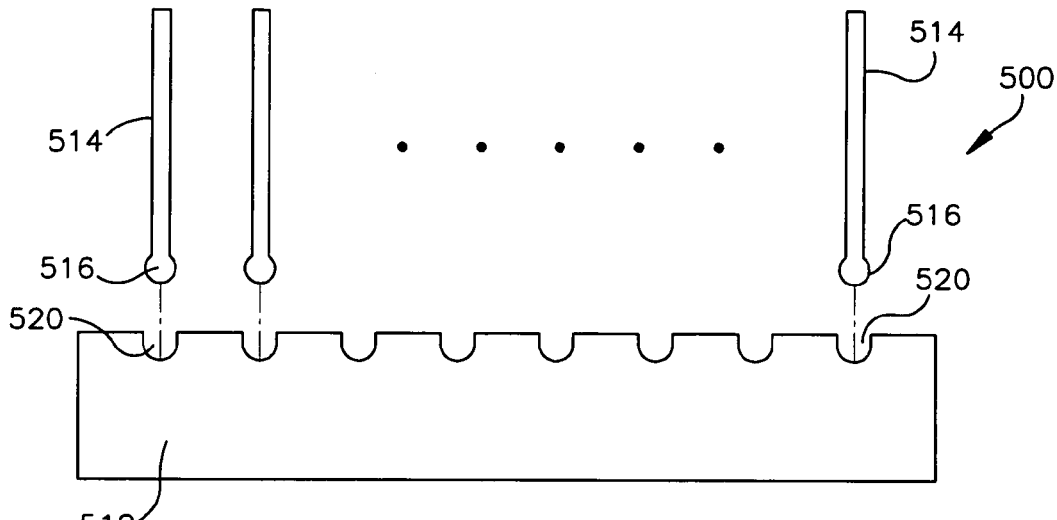
FIG. 5 is a side view of another exemplary heatsink before attaching the fins in accordance with the present invention.
Figure 6:
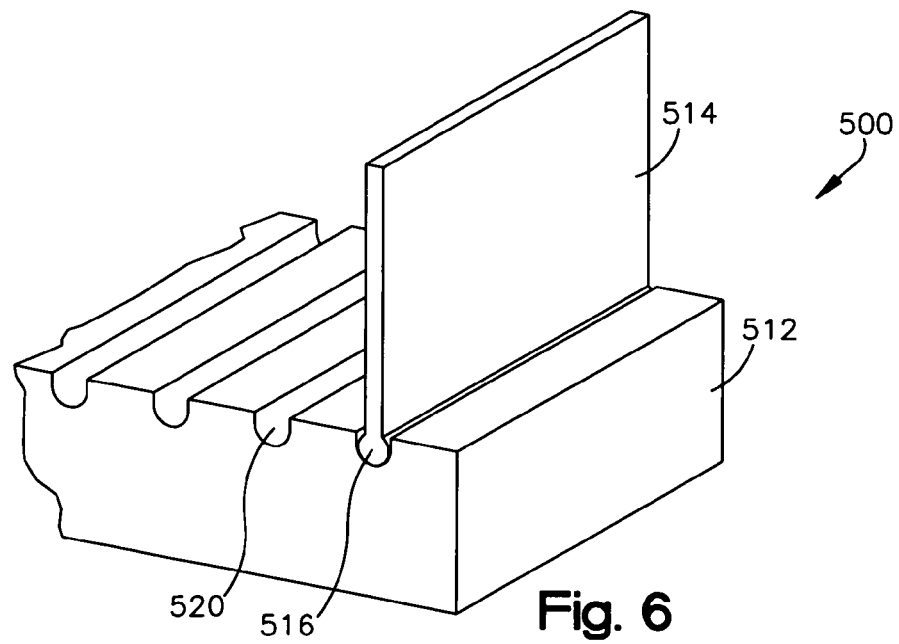
FIG. 6 is a partial perspective view of the exemplary heatsink of FIG. 5 with a fin attached in accordance with the present invention.

FIGS. 5 and 6 show an alternate exemplary embodiment of a heatsink 500. In this embodiment, each fin 514 has a rounded end 516 that is shaped and sized to be inserted into a rounded groove 520 in base 512. The fins and base are assembled as discussed in connection with FIG. 4. The rounded end 516 locks the fins within the grooves since the diameter of the rounded end is larger than the opening to the groove.

Figure 7:
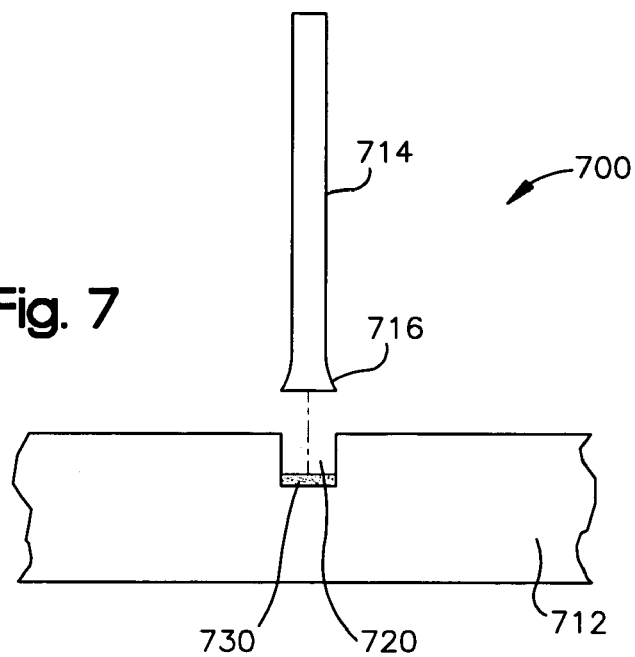
FIG. 7 is a side view of another exemplary heatsink before attaching the fins in accordance with the present invention.

FIG. 7 shows another alternate exemplary embodiment of a heatsink 700. In this embodiment, each fin 714 has a tapered end 716 that is shaped and sized to be inserted into a tapered groove 720 in base 712. The fins and base are assembled as discussed in connection with FIG. 4. The tapered end 716 locks the fins within the grooves since the width of the tapered end is larger than the opening to the groove.

Figure 8:
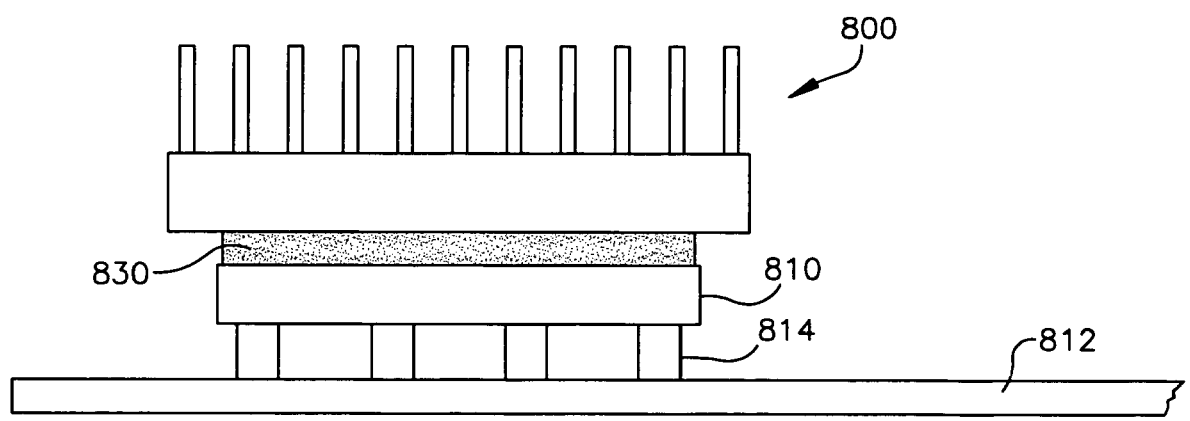
FIG. 8 shows a side view of an exemplary heatsink mounted to a heat generating component on a printed circuit board in accordance with the present invention.

Heatsinks in accordance with embodiments of the present invention are utilized in a variety of embodiments. By way of example, FIG. 8 illustrates a heatsink 800 being used to dissipate heat from a heat generating component 810. The heat generating component 810 mounts to a printed circuit board (PCB) 812 via pins 814 or other connectors. The heatsink is placed on a top surface of the heat generating component 810.

In one exemplary embodiment, a thermal compound or thermal interface material 830 is disposed between the heat generating component 810 and heatsink 800. For example, thermally conductive resins, tapes, molded thermoplastic compounds, adhesives, gap pads, and greases can be used between a heat generating component and heatsink to improve heat dissipation and/or heat transfer.

As used herein, a "heatsink" is a component designed to reduce the temperature of a heat-generating device or component. A heatsink, for example, can dissipate heat in a direct or indirect heat exchange with electronic components, the heat being dissipated into surrounding air or surrounding environment. Numerous types of heatsinks can be utilized with embodiments in accordance with the present invention. For example, embodiments can include heatsinks without a fan (passive heatsinks) or heatsinks with a fan (active heatsink). Other examples of heatsinks include extruded heatsinks, folded fin heatsinks, cold-forged heatsinks, bonded/fabricated heatsinks, and skived fin heatsinks. Further, the heatsinks, can use liquids or phase change material. Further, heatsinks can utilize a variety of embodiments to dissipate heat, such as slots, holes, fins, rods, pins, etc.

As used herein, a "heat-generating device" or "heat generating component" includes any electronic component that generates heat during operation. For example, heat-generating devices include, but are not limited to, resistors, capacitors, diodes, memories, electronic power circuits, integrated circuits (ICs) or chips, digital memory chips, application specific integrated circuits (ASICs), processors (such as a central processing unit (CPU) or digital signal processor (DSP)), discrete electronic devices (such as field effect transistors (FETs)), other types of transistors, or devices that require heat to be thermally dissipated from the device for the device to operate properly or within a specified temperature range.

The fins can include an outer coating. The coating, for example, can increase heat conduction and/or inhibit flaking or chipping of the graphite material. In one exemplary embodiment, the coating is a metal with a high coefficient of thermal heat transfer. Examples include, but are not limited to, composite materials, aluminum, copper, silver, nickel, various alloys, and other metals.

One skilled in the art will appreciate that a discussion of various methods should not be construed as steps that must proceed in a particular order. Additional steps may be added, some steps removed, or the order of the steps altered or otherwise changed.

While the invention has been disclosed with respect to a limited number of embodiments, those skilled in the art will appreciate, upon reading this disclosure, numerous modifications and variations. It is intended that the appended claims cover such modifications and variations and fall within the true spirit and scope of the invention.

What is claimed is:

1. A heatsink, comprising:
   a metal base having a plurality of grooves; and
   a plurality of graphite fins connected to the base for thermally dissipating heat from the base and into a surrounding environment, wherein the fins are secured within the grooves with an interference fit produced by thermally expanding the base.

2. The heatsink of claim 1, wherein the base is formed from aluminum or copper.

3. The heatsink of claim 1, wherein the base is formed from a material different than graphite.

4. The heatsink of claim 1, wherein the interference fit is also produced by lowering the temperature of the fins so the fins contract.

5. The heatsink of claim 1, wherein the tins have a rounded end and the grooves are sized and shaped to lock with the rounded ends of the fins.

6. The heatsink of claim 1, wherein the fins have a tapered end.

7. The heatsink of claim 1, wherein the grooves have a width smaller than a thickness of ends of the fins, the ends being fit with in the grooves.

8. A heatsink, comprising:
   a metal base having plural grooves formed on an outer surface; and
   plural graphite fins extending from the base for dissipating heat from the heatsink, the grooves being thermally expanded to receive the fins and then cooled to provide a secure attachment between the fins and the base.

9. The heatsink of claim 8, wherein the base is formed from one of aluminum or copper.

10. The heatsink of claim 8, further comprising a thermal grease disposed in the grooves to enhance thermal conductivity.

11. The heatsink of claim 8, wherein the fins are attached to the grooves while the grooves are elevated to temperature above room temperature.

12. The heatsink of claim 8, wherein the fins are cooled to a temperature below room temperature prior to attaching the fins and the base.

13. The heatsink of claim 8, wherein the fins have a rounded end.

14. The heatsink of claim 8, wherein the fins have a tapered end.

15. The heatsink of claim 8, wherein the grooves have a opening that is smaller than an end of the fins that is inserted into the grooves.

16. A method, comprising:
heating a base to expand a plurality of grooves;
inserting a plurality of fins into the grooves while the base is heated, the base and fins forming a heatsink; and
connecting the heatsink to an electronic heat generating component to dissipate heat away from the heat generating component.

17. The method of claim 16 further comprising cooling, prior to inserting the fins into the grooves, the tins to a temperature below room temperature to contract the fins.

18. The method of claim 16 further comprising inserting a thermal grease into the grooves to enhance thermal conductivity between the base and the fins.

19. The method of claim 16 further comprising providing an interference fit between the fins and the grooves sufficient to securely attach the fins to the base.

20. The method of claim 16 further comprising configuring an end of the fins so the fins lock into the grooves.

* * * * *